US005547813A

United States Patent [19]
Tsujita

[11] Patent Number: 5,547,813
[45] Date of Patent: Aug. 20, 1996

[54] METHOD OF FORMING A FINE RESIST PATTERN OF HIGH RESOLUTION USING A CONTRAST ENHANCEMENT LAYER

[75] Inventor: Kouichirou Tsujita, Hyogo-ken, Japan

[73] Assignee: Mitsubishi Denki Kabushiki Kaisha, Tokyo, Japan

[21] Appl. No.: 40,195

[22] Filed: Mar. 31, 1993

[30] Foreign Application Priority Data

Sep. 17, 1992 [JP] Japan .................................. 4-248035

[51] Int. Cl.⁶ ..................................................... G03C 5/00
[52] U.S. Cl. ........................... 430/325; 430/311; 430/326
[58] Field of Search ..................................... 430/311, 325, 430/326

[56] References Cited

U.S. PATENT DOCUMENTS

| | | | |
|---|---|---|---|
| 4,278,327 | 7/1981 | McMahon et al. | 359/39 |
| 4,575,399 | 3/1986 | Tanaka et al. | 430/296 |
| 4,663,275 | 5/1987 | West et al. | 430/326 |
| 5,146,086 | 9/1992 | De et al. | 250/253 |

FOREIGN PATENT DOCUMENTS 60-38821  2/1985  Japan .
2-212851  8/1990  Japan .

OTHER PUBLICATIONS

Aldrich Catalog, pp. F19, 797, 1028, Published 1992.
T. Tanaka et al., "A New Photolithography Technique With Antireflective Coating On Resist: ARCOR", J. Electrochem, Soc., vol. 137, No. 12, pp. 3900–3904, Dec. 1990.

Primary Examiner—George F. Lesmes
Assistant Examiner—Laura Weiner
Attorney, Agent, or Firm—Lowe, Price, LeBlanc & Becker

[57] ABSTRACT

The present invention provides a method of forming a fine resist pattern using a contrast enhancement layer improved so that the dimension accuracy of patterning is improved regardless of difference in resist film thickness according to position. A resist is formed on a substrate. A middle layer having the index of refraction adjusted to 1.3 to 1.4 is formed on the resist to prevent the contrast enhancement layer and the resist from being mixed. A contrast enhancement layer is formed on the middle layer. Light is selectively directed towards the resist from above the contrast enhancement layer. Then, the contrast enhancement layer and the middle layer are removed, followed by development of the resist.

5 Claims, 10 Drawing Sheets

RESIST PATTERN DIMENSION

RESIST FILM THICKNESS

FIG.11 PRIOR ART $$R = f(t, b, \delta) = \frac{t + b\delta}{1 + tb\delta} \quad \text{------ (1)}$$

$$t = \frac{n_1 - n_2}{n_1 + n_2} \quad \text{------ (2)}$$

$$b = \frac{n_2 - n_3}{n_2 + n_3} \quad \text{------ (3)}$$

$$\delta = \exp\left\{-i \cdot \frac{2d}{\lambda'} \cdot 2\pi\right\} \quad \text{------ (4)}$$

$$\lambda' = \frac{\lambda}{n_2} \quad \left(\begin{array}{l}\lambda' : \text{WAVELENGTH IN RESIST} \\ \lambda : \text{WAVELENGTH IN VACUUM}\end{array}\right)$$

METHOD OF FORMING A FINE RESIST PATTERN OF HIGH RESOLUTION USING A CONTRAST ENHANCEMENT LAYER

BACKGROUND OF THE INVENTION

1. Field of the Invention

The present invention relates to a method of forming a fine resist pattern, and more particularly, to a method of forming a fine resist pattern of high resolution using a contrast enhancement layer.

2. Description of the Background Art

Figure 6:
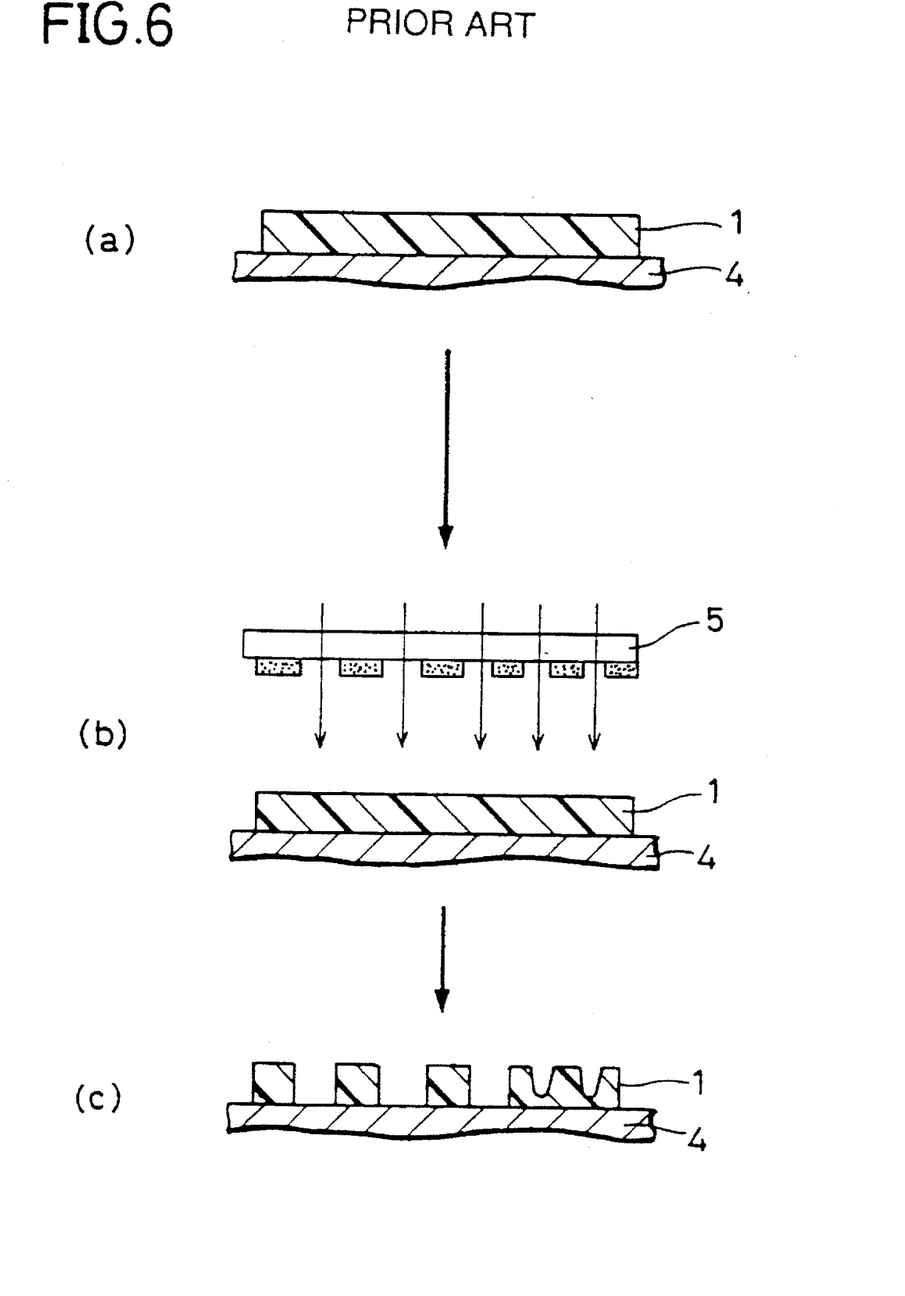

FIG. 6 is a sectional view of a substrate showing steps of conventional photolithography for forming a fine resist pattern.

Referring to FIG. 6(a), a positive type photoresist 1 is applied on a substrate 4. Referring to FIG. 6(b), light is directed selectively onto the positive type photoresist 1 using a mask 5. Referring to FIG. 6(c), the positive type photoresist 1 is developed. According to this method, there were problems of poor contrast and low resolution as shown in FIG. 6(c).

In order to solve such problems, a CEL technique (contrast enhancement photolithography) was developed.

Figure 7:
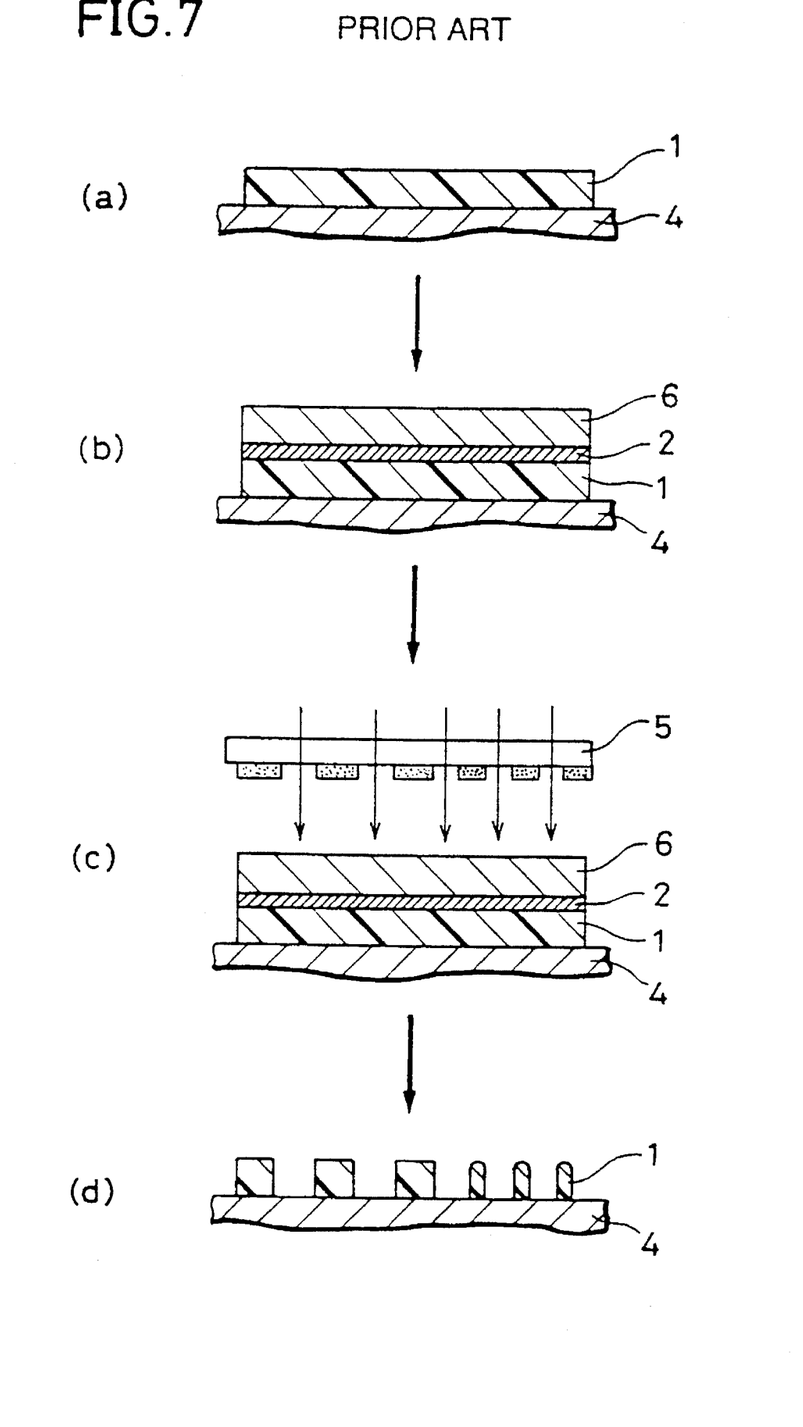

FIG. 7 is a sectional view of a substrate showing various steps of a conventional CEL technique.

Referring to FIG. 7(a), a positive type photoresist 1 is applied on a substrate 4.

Referring to FIG. 7(b), a middle layer 2 is formed on the positive type photoresist 1. A contrast enhancement layer (referred to as CEL hereinafter) 6 is formed on the middle layer 2. The middle layer 2 serves to prevent mixing of the CEL 6 and the positive type photoresist 1. As disclosed in Japanese Patent Laying-Open No. 2-212851, the CEL 6 has great absorption with respect to the exposure wavelength prior to exposure, which is gradually reduced as exposure is carried out. That is to say, the CEL 6 is a layer containing material that increases the transmittance of light (called light fading dye component). Diazonium salt, stilbazolium salt, aryl-nitroso salt are known as light fading dye components. A phenol type resin is used as the coating formation component.

Referring to FIG. 7(c), light is selectively directed towards the positive type resist 1 having the CEL 6 applied using a mask 5.

Referring to FIGS. 7(c) and 7(d), the CEL 6 and the middle layer 2 are separated by water. Then, the positive type photoresist 1 is developed. According to this method, the CEL formed on the positive type photoresist 1 has the exposed portion thereof substantially transparent, so that the contrast between the exposed portion and the non-exposed portion is enhanced. Thus, a fine resist pattern of high resolution is obtained.

Figure 8:
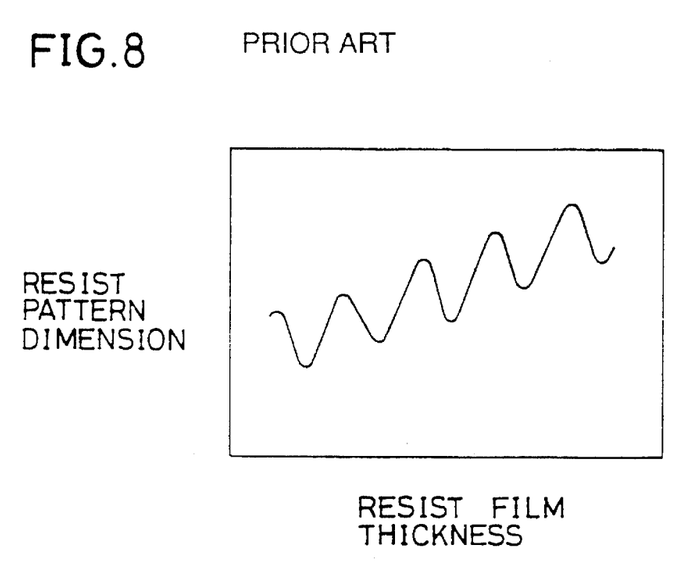
FIG. 8 shows the relationship between the resist pattern dimension and the resist film thickness when a resist pattern is formed by applying a resist on a substrate, followed by lithography.

Although the above-described CEL technique allows the formation of a fine resist pattern of high resolution, there was the problem of variance in the dimension of the resist pattern when the resist film thickness changes, as shown in FIG. 8. This phenomenon is called the effect of multiple reflection in a film.

Figure 9:
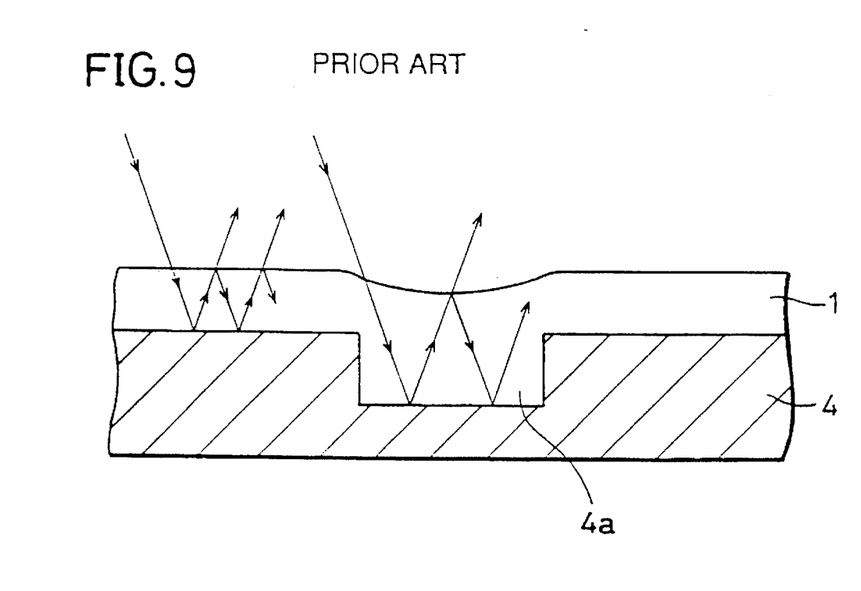
FIG. 9 is a sectional view of a substrate when light is directed to a resist applied on a substrate having a stepped portion.

FIG. 9 shows a case where a resist 1 is applied on a substrate 4 having a stepped portion 4a as a typical example where there is a change in the thickness of the resist film.

Variation in the dimension of a resist pattern due to a change in resist film thickness is caused by the surface reflectance of the CEL being altered in accordance with the film thickness of the resist. This is because the amount of variation of the surface reflectance corresponds to the amount of variation of the exposure energy to the resist. The exposure energy to a resist is reduced as the surface reflectance is increased and increases as the surface reflectance is reduced. This means that the dimension of a resist pattern will not be changed by variation in the resist film thickness if the surface reflectance takes a constant value regardless of a change in the film thickness of a resist.

Calculation of surface reflectance will be described hereinafter.

Figure 10:
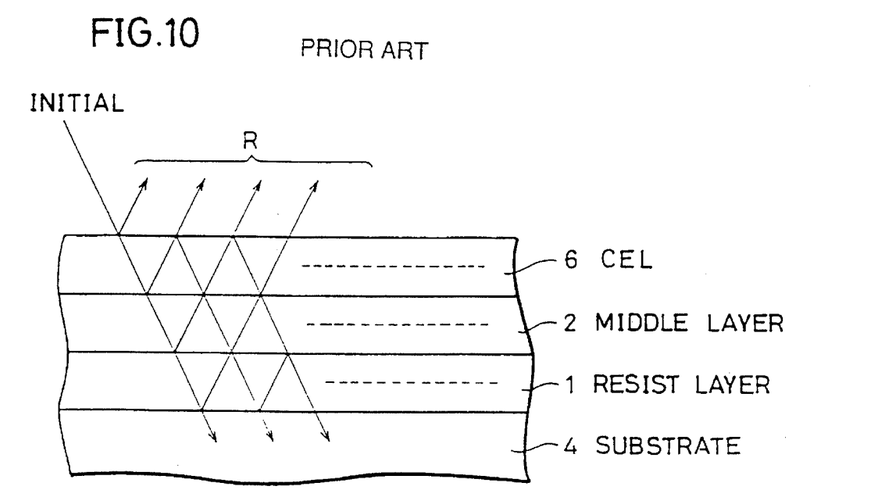
FIG. 10 shows the path of light in a multilayer film.

FIG. 10 shows a light path in a multilayer film.

Referring to FIG. 10, a portion of light entering from the surface (Initial) repeats reflection and refraction infinitely to eventually exit from the surface of the CEL 6. The surface reflectance R is the ratio of energy ($E_1$) of light entering the surface (Initial) to energy ($E_2$) of the total light of the infinite light from the surface of the CEL 6, i.e. $E_2/E_1$.

Because the calculation of the surface reflectance of a multilayer film is complicated, the calculation of the surface reflectance of a single layer film will first be described.

Figure 11:
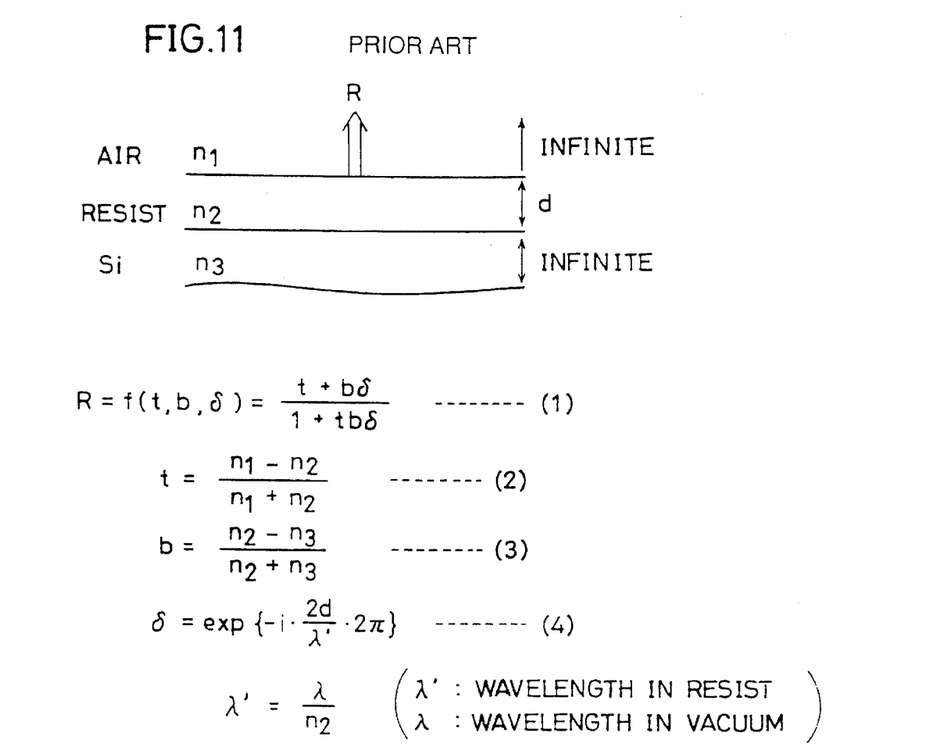
FIG. 11 shows a method of calculating surface reflectance R.

FIG. 11 shows a method of calculating the surface reflectance in the case where a resist is provided on a silicon substrate. In FIG. 11, $n_1$, $n_2$, and $n_3$ represent indexes of refraction.

The surface reflectance R is represented by functions t, b, and $\delta$, as shown in the equation (1), where t represents the reflectance (Fresnel coefficient) at the $n_1/n_2$ face (the top face of the resist) which is expressed by the equation (2). b represents the reflectance (Fresnel coefficient) at the $n_2/n_3$ face (the bottom face of the resist) and is expressed by the equation (3). $\delta$ represents the change in phase in the resist and is expressed by the equation (4).

Figure 12:
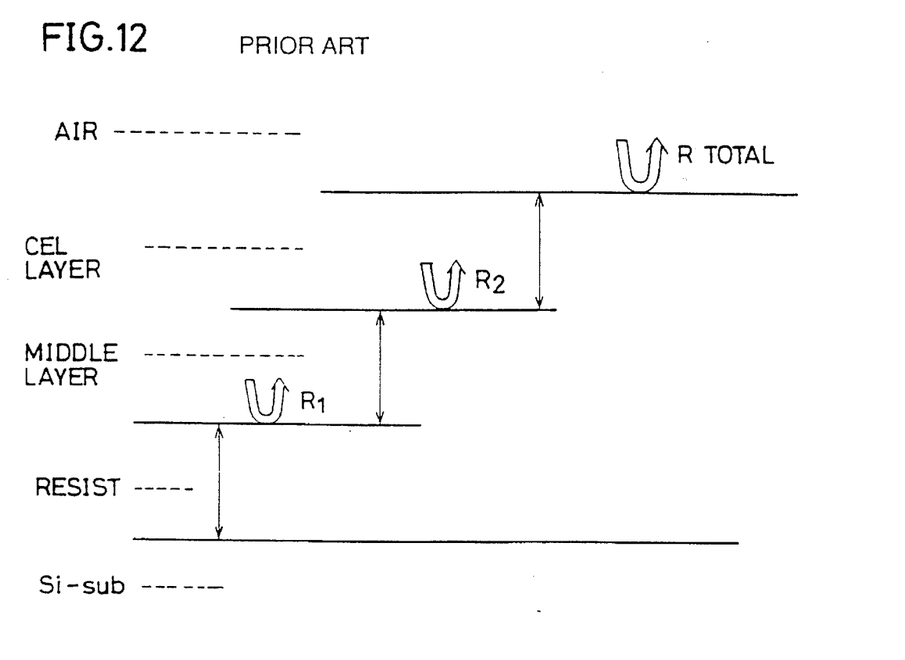
FIG. 12 shows a method of calculating the surface reflectance of a multilayer film.

The surface reflectance of a multilayer film shown in FIG. 12 can be obtained by applying the basic method shown in FIG. 11.

Referring to FIG. 12, the surface reflectance of a multilayer film is obtained by the steps of calculating the surface reflectance ($R_1$) at the interface between the resist and the middle layer, calculating the surface reflectance ($R_2$) at the interface between the middle layer and the CEL on the basis of the surface reflectance $R_1$, and calculating the surface reflectance ($R_{total}$) at the surface of the CEL on the basis of the surface reflectance $R_2$.

The method of calculating the surface reflectance of a multilayer film will be described more specifically hereinafter.

It is necessary to calculate the film thickness and the index of refraction respectively of the middle layer and the CEL material in calculating the surface reflectance of a multilayer film. Logically, these selections have a great degree of freedom.

Because the characteristic of light fading must be applied to the CEL material, the material thereof is limited. As a result, the selection of the index of refraction of the CEL material is generally fixed to approximately 1.7.

Therefore, the degree of freedom includes three types which is the index of refraction and the film thickness of the middle layer, and the film thickness of the CEL material.

Figure 13:
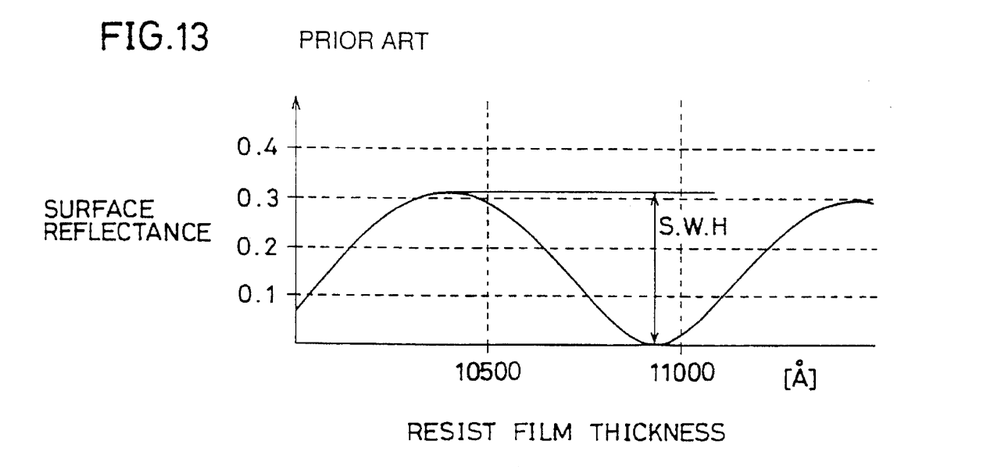
FIG. 13 shows the relationship between the resist film thickness and the surface reflectance when the middle layer has an index of refraction and a film thickness of 1.5 and 1000Å, respectively, and the CEL has a film thickness of 1500Å (index of refraction is 1.66).

FIG. 13 shows the change in the calculated value of the surface reflectance when the film thickness of the resist is varied in a multilayer film structure of the middle layer having an index of refraction and a film thickness of 1.5 and 1000Å, respectively, and CEL material having a film thickness of 1500Å (index of refraction is 1.66), for example.

Referring to FIG. 13, the abscissa indicates the film thickness of the resist, and the ordinate represents the surface reflectance. In FIG. 13, S.W.H (Standing Wave Height) represents the amplitude of the surface reflectance.

The S.W.H value can have the amplitude obtained from the relationship between the resist film thickness and the surface reflectance of FIG. 13. A great value of S.W.H indicates that the variation in the surface reflectance is great. A low S.W.H value indicates that the variation in the surface reflectance is small. A small change in the surface reflectance means that the surface reflectance is maintained substantially at a constant value even if there is a change in the film thickness of the resist, so that the dimension of the resist pattern is not easily varied by a change in the film thickness of the resist.

SUMMARY OF THE INVENTION

An object of the present invention is to obtain a method of forming a fine resist pattern using a contrast enhancement layer that is improved to have suppressed an effect of multiple reflection in a film using the aforementioned calculation method.

Another object of the present invention is to provide a method of forming a fine resist pattern using a contrast enhancement layer that is improved so that the dimension of the resist pattern does not change even when the film thickness of a resist differs.

A further object of the present invention is to provide a method of forming a fine resist pattern using a contrast enhancement layer that is improved so that the S.W.H can be reduced to half of that of conventional lithography.

Still another object of the present invention is to provide a method of forming a fine resist pattern using a contrast enhancement layer that is improved so that the S.W.H can be reduced to not more than 15%.

The present invention relates to a method of forming a fine resist pattern of high resolution using a contrast enhancement layer. A resist is applied on a substrate. A middle layer having the index of refraction adjusted to not more than 1.4 is formed on the resist to prevent the contrast enhancement layer and the resist layer from being mixed. A contrast enhancement layer is formed on the middle layer. Light is selectively directed towards the resist from above the contrast enhancement layer. The contrast enhancement layer and the middle layer are removed, followed by the development of the resist.

According to a preferable embodiment of the present invention, the middle layer has a film thickness of 350Å–850Å, and the contrast enhancement layer has a film thickness within the range of 950Å–1250Å or an integral multiple thereof.

According to a method of forming a fine resist pattern of the present invention, the index of refraction of the middle layer formed on the resist is adjusted to be not more than 1.4, so that the S.W.H can be reduced to less than 15% by appropriately selecting the film thickness of the middle layer and the film thickness of the CEL.

BRIEF DESCRIPTION OF THE DRAWINGS

FIGS. 1(a)–(d) are partial sectional views of a semiconductor device showing various steps of a method of forming a fine resist pattern using a CEL according to an embodiment of the present invention.

FIGS. 6(a)–(c) are partial sectional views of a semiconductor device showing various steps of conventional photolithography technique.

FIGS. 7(a)–(d) are partial sectional views of a semiconductor device showing various steps of conventional CEL technique.

DESCRIPTION OF THE PREFERRED EMBODIMENTS

An embodiment of the present invention will be described hereinafter with reference to the drawings.

Figure 1:
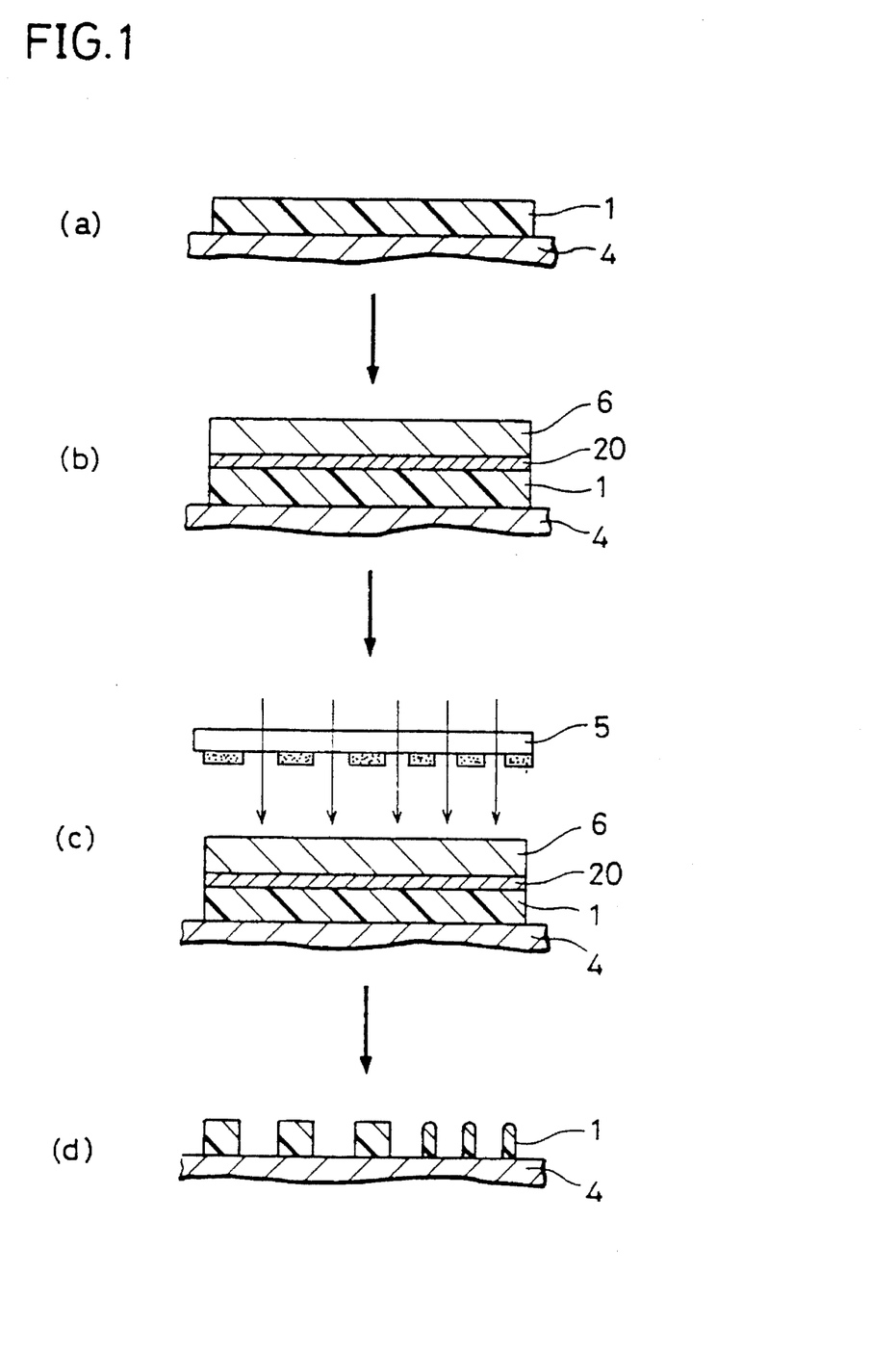

FIG. 1 is a partial sectional view of a semiconductor device showing various steps in order of a method of forming a fine resist pattern of high resolution using a contrast enhancement layer according to an embodiment of the present invention.

Referring to FIG. 1(a), a positive type photoresist 1 is formed on a substrate 4.

Referring to FIG. 1(b), a middle layer 20 having the index of refraction adjusted to be not more than 1.4 is formed on the positive photoresist layer 1.

The reason why the index of refraction of the middle layer 20 is to be set to not more than 1.4, and the limitations for the following numerical values will be described afterwards. The middle layer 20 is provided for preventing the contrast enhancement layer 6 and the positive photoresist 1 from being mixed. The middle layer 20 is formed of polyacrylic acid and has the index of refraction adjusted by the fluorine type surfactant. The film thickness of the middle layer 20 is preferably 350Å–850Å.

The contrast enhancement layer 6 is formed on the middle layer 20. The contrast enhancement layer 6 has a film thickness preferably within the range of 950Å–1250Å or an integral multiple thereof.

If the contrast enhancement layer 6 is set to a film thickness of 1200±50Å or an integral multiple thereof when the film thickness of the middle layer is 400±50Å, the S.W.H can be brought to not more than 15%, as will be described later.

If the CEL 6 is set to a film thickness of 1100±50Å or an integral multiple thereof when the film thickness of the middle layer 20 is 600±50Å, the S.W.H can be brought to not more than 15%.

If the CEL 6 is set to a film thickness of 1000±50Å or an integral multiple thereof when the film thickness of the middle layer 20 is 800±50Å, the S.W.H can be brought to not more than 15%.

Referring to FIG. 1(c), light is selectively directed towards the positive type photoresist 1 from above the CEL 6 using a mask 5.

Referring to FIGS. 1(c) and (d), the CEL 6 and the middle layer 20 are separated by water.

Referring to FIG. 1(d), the positive photoresist 1 is developed. Thus, the change in surface reflectance can be reduced because the S.W.H can be brought to not more than 15% according to the above described method (according to the lithography method using a conventional resist shown in FIG. 6, the S.W.H is 28%). Little change in the surface reflectance means that the surface reflectance is maintained at substantially a constant value even if there is a change in the resist film thickness, which in turn means that the dimension of the resist pattern is not easily varied in response to a change in the film thickness of the resist.

Figure 2:
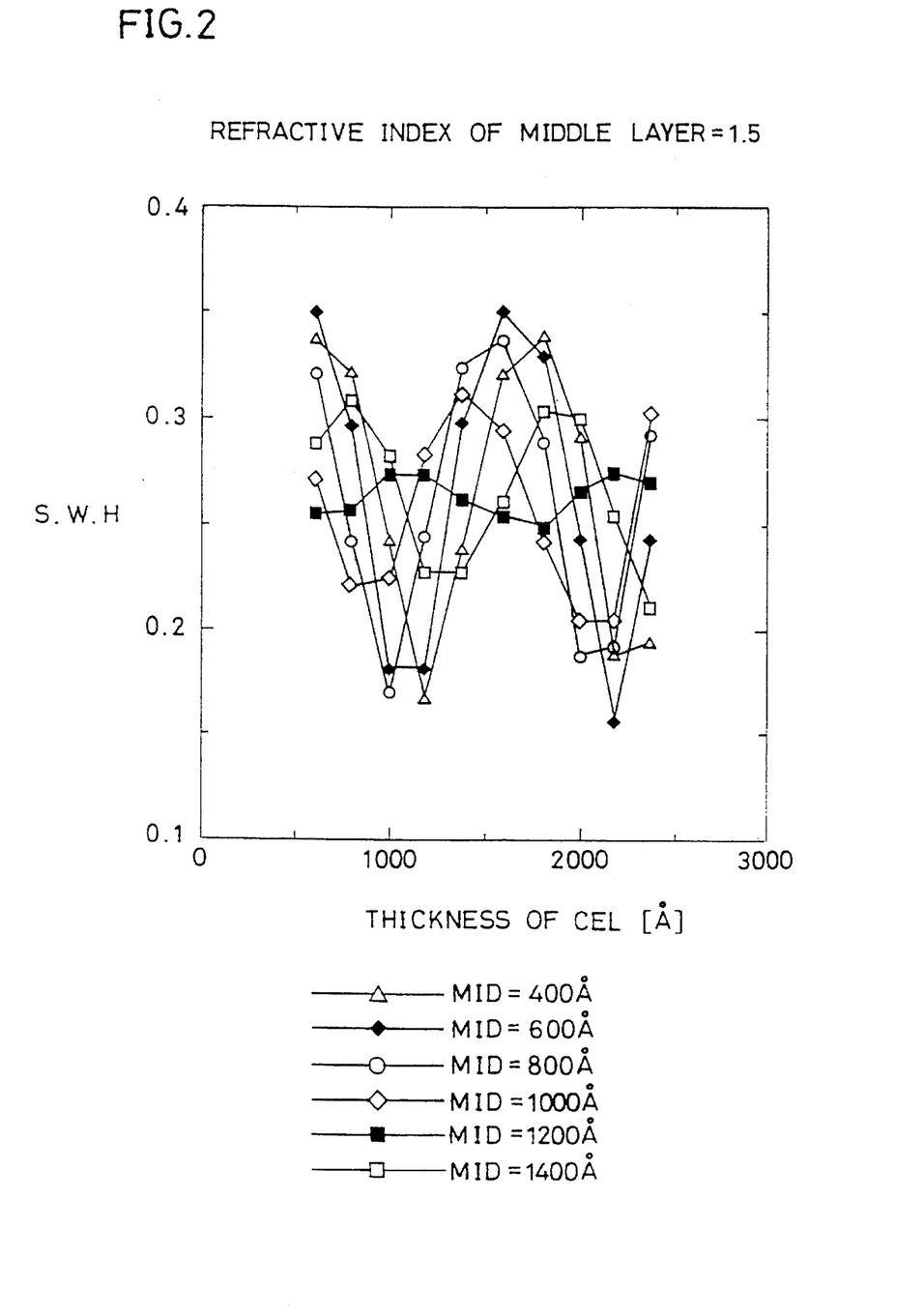
FIG. 2 shows the relationship between the film thickness of a CEL and the S.W.H when the middle layer has an index of refraction of 1.5 and a variable film thickness.

FIG. 2 is a graph showing the value of the S.W.H in accordance with a change in film thickness of the CEL with the middle layer having an index of refraction of 1.5 and a film thickness of 400, 600, 800, 1000, 1200, and 1400Å. It became clear from FIG. 2 that the S.W.H can not be brought to not more than 15% if the index of refraction of the middle layer is set to 1.5 regardless of the film thicknesses of the middle layer and the CEL.

Figure 3:
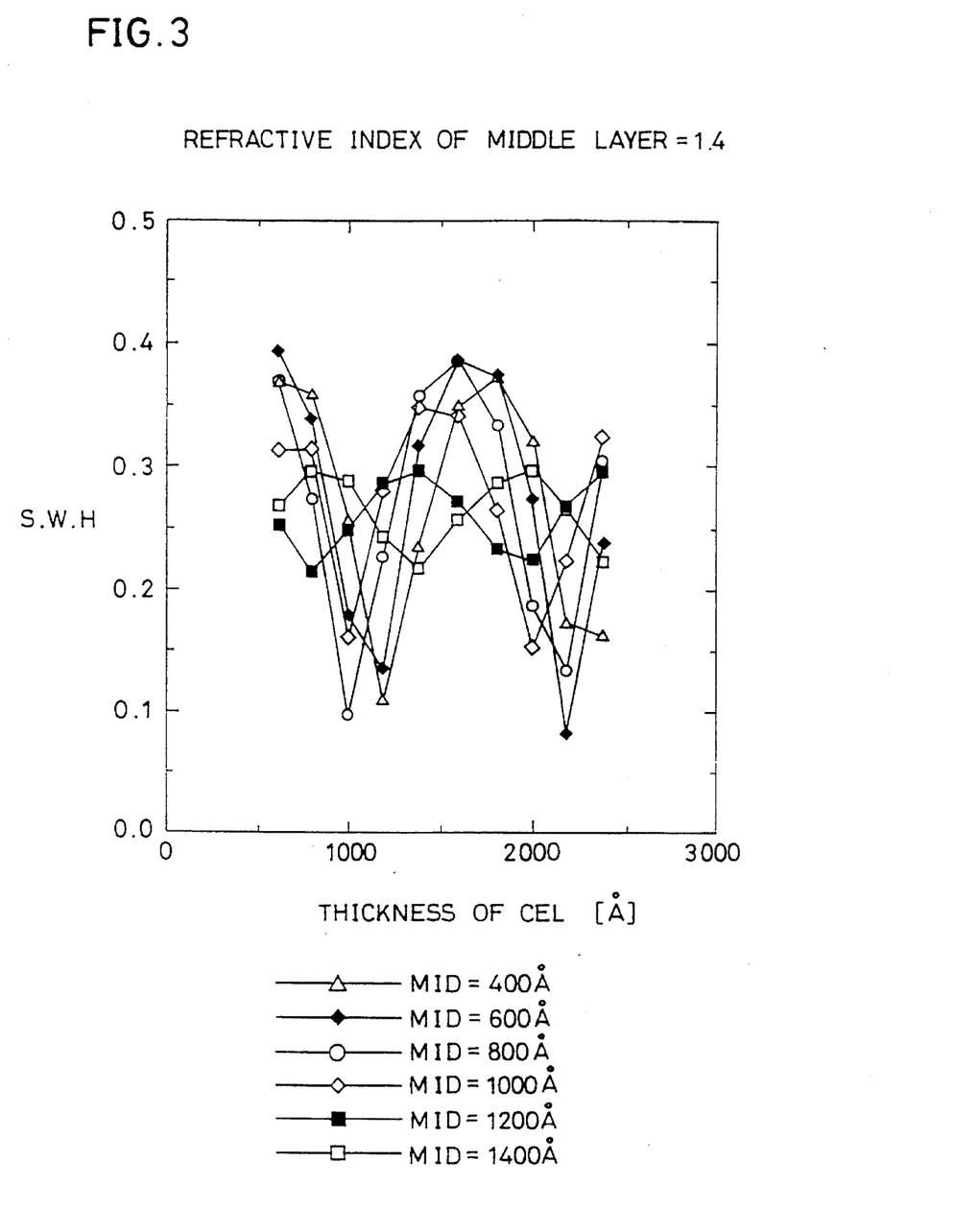
FIG. 3 shows the relationship between the film thickness of a CEL and the S.W.H when the middle layer has an index of refraction of 1.4 and a film thickness within the range of 400–1400Å.

FIG. 3 is a graph showing the S.W.H value in accordance with a change in the film thickness of the CEL with the middle layer having an index of refraction of 1.4 and a film thickness of 400, 600, 800, 1000, 1200 and 1400Å.

Figure 4:
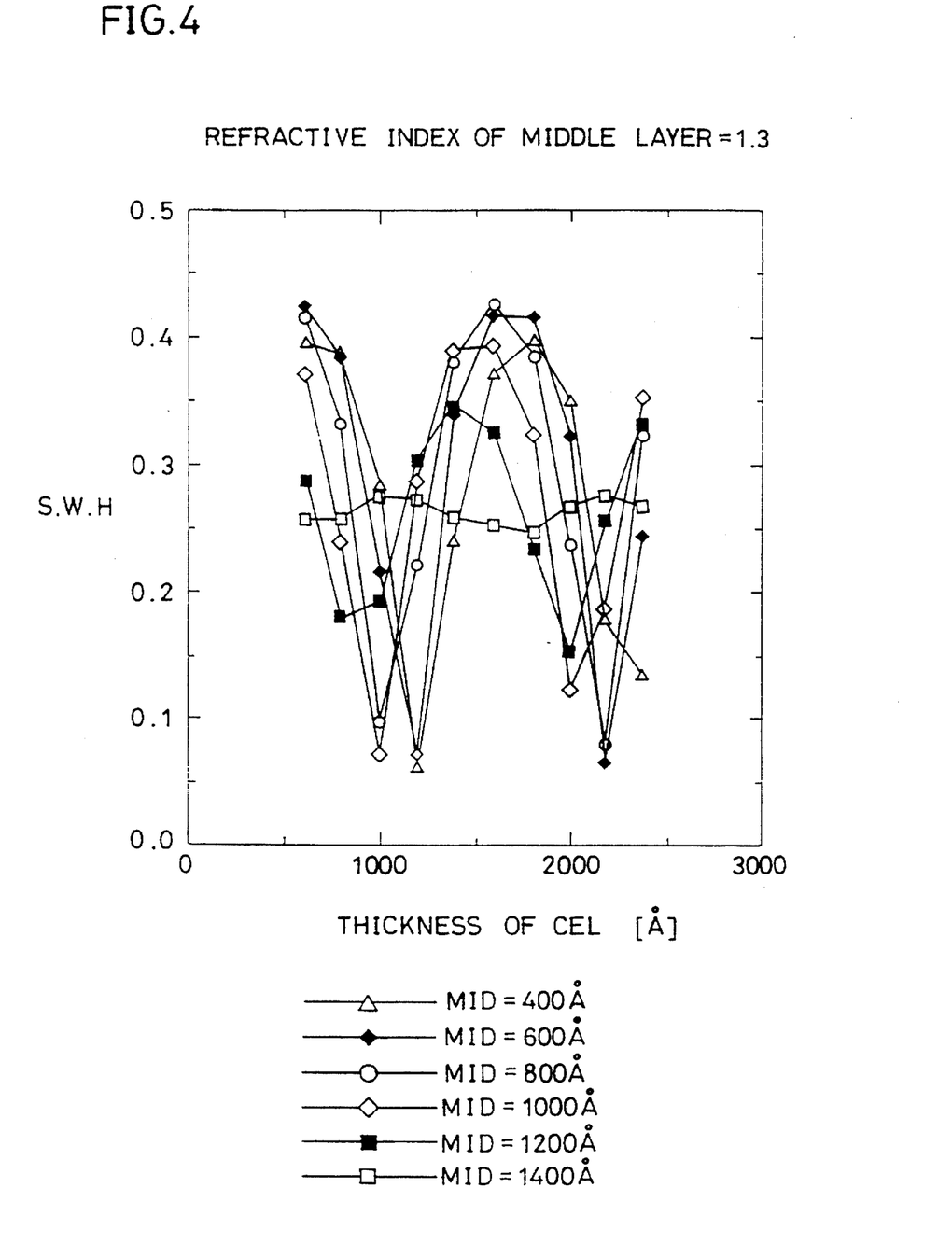
FIG. 4 shows the relationship between the film thickness of the CEL and the S.W.H when the middle layer has an index of refraction of 1.3 and a film thickness varied within the range of 400–1400Å.

FIG. 4 is a graph showing the value of the S.W.H in accordance with a change in the film thickness of the CEL with the middle layer having an index of refraction of 1.3 and a film thickness of 400, 600, 800, 1000, 1200 and 1400Å.

Figure 5:
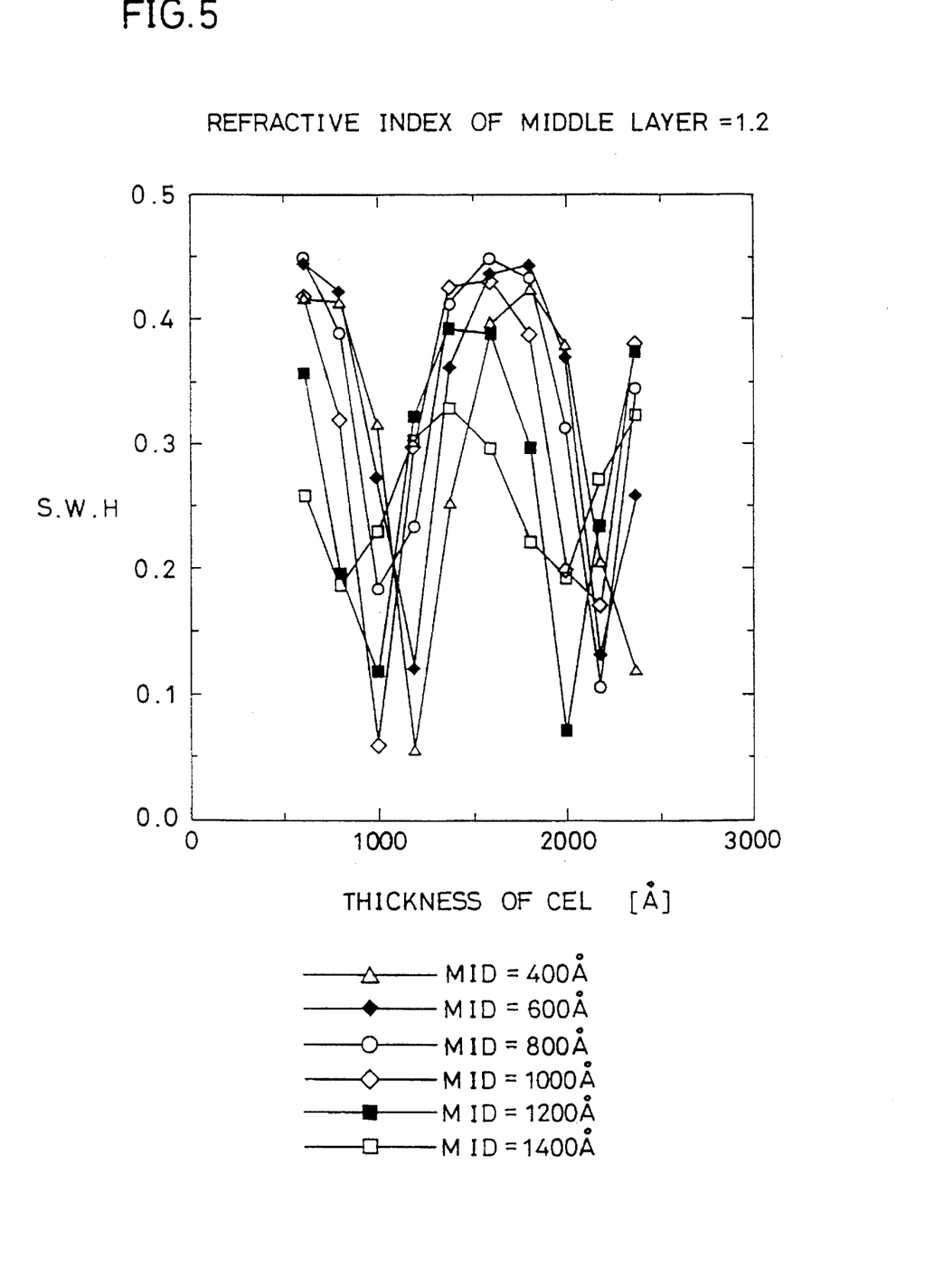
FIG. 5 shows the relationship between the film thickness of the CEL and the S.W.H when the middle layer has an index of refraction of 1.2 and a film thickness within the range of 400–1400Å.

FIG. 5 is a graph showing the value of the S.W.H in accordance with the change in the film thickness of the CEL with the middle layer having an index of refraction of 1.2 and a film thickness of 400, 600, 800, 1000, 1200 and 1400Å.

It is apparent from these graphs that the S.W.H can be brought to not more than 15% by selecting an appropriate thickness of the middle layer and the CEL if the index of refraction of the middle layer is within the range of 1.2–1.4.

That is to say, the S.W.H can be brought to not more than 15% by setting the film thickness of the CEL to 1200±50Å or an integral multiple thereof when the film thickness of the middle layer is 400±50Å.

Also, the S.W.H can be brought to not more than 15% by setting the CEL to a film thickness of 1100±50Å or an integral multiple thereof when the film thickness of the middle layer is 600±50Å.

Furthermore, the S.W.H can be brought to not more than 15% by setting the CEL to a film thickness of 1000±50Å or an integral multiple thereof when the middle layer has a film thickness of 800±50Å.

It is appreciated from FIG. 5 that the range of an allowable value of the film thickness of the CEL to bring the S.W.H to not more than 15% is very small when the index of refraction of the middle layer is less than 1.3, i.e. 1.2. The S.W.H will exceed 28% (the conventional case shown in FIG. 6) drastically if the film thickness of the CEL slightly exceeds the allowable value of the film thickness of the CEL. In general, there is no material that has an index of refraction that is less than 1.3. Therefore, the index of refraction of the middle layer must be within the range of 1.3–1.4.

According to a method of forming a fine resist pattern of the present invention, the S.W.H can be brought to not more than 15% by selecting an appropriate film thickness of the middle layer and the CEL because the middle layer formed on the resist has its index of refraction adjusted to not more than 1.4. A small value of S.W.H means that there is little change in the surface reflectance, which in turn means that the dimension of the resist pattern is not easily varied in response to a change in the film thickness of the resist. As a result, the dimension accuracy of patterning can be improved even if there is difference in the resist film thickness according to its location by using the method of the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a fine resist pattern of high resolution using a contrast enhancement layer, comprising the steps of:

forming a resist on a substrate, forming a middle layer having the index of refraction adjusted to 1.3 to 1.4 on said resist for preventing said contrast enhancement layer and said resist from being mixed, forming said contrast enhancement layer on said middle layer, selectively directing light towards said resist from above said contrast enhancement layer, removing said contrast enhancement layer and said middle layer, and developing said resist, wherein the film thickness of said middle layer and said contrast enhancement layer are selected from the group consisting of the following (a), (b) and (c) in which n denotes an integral number,
  a) said contrast enhancement layer has a film thickness set to n×(1200±50)Å when the film thickness of said middle layer is (400±50)Å,
  b) said contrast enhancement layer has a film thickness set to n×(1100±50)Å when the film thickness of said middle layer is (600+50)Å, and
  c) said contrast enhancement layer has a film thickness set to n×(1000±50)Å when the film thickness of said middle layer is (800±50)Å.

2. The method according to claim 1, wherein said contrast enhancement layer and said middle layer have film thicknesses according to (a).

3. The method according to claim 1, wherein said contrast enhancement layer and said middle layer have film thicknesses according to (b).

4. The method according to claim 1, wherein said contrast enhancement layer and said middle layer have film thicknesses according to (c).

5. The method according to claim 1, wherein said middle layer is formed of polyacrylic acid, and said index of refraction is adjusted by a fluorine type surfactant.

* * * * *